United States Patent
Ha et al.

(10) Patent No.: US 11,570,938 B2
(45) Date of Patent: Jan. 31, 2023

(54) DISPLAY DEVICE

(71) Applicant: LG Display Co., Ltd., Seoul (KR)

(72) Inventors: GyungBo Ha, Gyeonggi-do (KR);
HakMo Hwang, Gyeonggi-do (KR);
SunBok Song, Gyeonggi-do (KR);
Seeun Kim, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 149 days.

(21) Appl. No.: 16/984,632

(22) Filed: Aug. 4, 2020

(65) Prior Publication Data
US 2021/0068315 A1    Mar. 4, 2021

(30) Foreign Application Priority Data

Aug. 27, 2019  (KR) .................. 10-2019-0105237
Jun. 15, 2020  (KR) .................. 10-2020-0072216

(51) Int. Cl.
*H05K 7/20* (2006.01)
*H05K 5/03* (2006.01)
*H05K 5/00* (2006.01)
*H05K 1/18* (2006.01)

(52) U.S. Cl.
CPC ......... *H05K 7/20963* (2013.01); *H05K 1/189* (2013.01); *H05K 5/0017* (2013.01); *H05K 5/03* (2013.01); *H05K 2201/10128* (2013.01)

(58) Field of Classification Search
CPC .... H05K 5/03; H05K 5/0017; H05K 7/20954; H05K 7/20963; H05K 1/189; H05K 2201/10128
See application file for complete search history.

(56) References Cited

U.S. PATENT DOCUMENTS

| 9,846,273 | B2* | 12/2017 | Ahn ................. G02B 6/0093 |
| 10,884,456 | B2* | 1/2021 | Lee ................... G06F 1/1601 |
| 2001/0012087 | A1 | 8/2001 | Sasuga et al. |
| 2009/0004408 | A1* | 1/2009 | Nakanishi ......... G02F 1/133308 |
| | | | 428/12 |

(Continued)

FOREIGN PATENT DOCUMENTS

| CN | 104065773 A | 9/2014 |
| CN | 104345491 A | 2/2015 |

(Continued)

OTHER PUBLICATIONS

Lee, Display Apparatus, Dec. 6, 2013, PE2E search English translation for KR101472340 (Year: 2013).*

(Continued)

*Primary Examiner* — Michael A Matey
(74) *Attorney, Agent, or Firm* — Polsinelli PC

(57) ABSTRACT

A display device includes a display panel, a back cover disposed on a rear surface of the display panel and including a plurality of layers, and a finishing portion disposed to surround at least a part of an outer side surface of the display panel and an outer side surface of the back cover. The back cover includes a first layer positioned on the rear surface of the display panel and disposed in an area including an area overlapping with the display panel, a second layer disposed apart from the first layer to oppose the first layer, and a core disposed between the first layer and the second layer.

18 Claims, 23 Drawing Sheets

(56) References Cited

U.S. PATENT DOCUMENTS

| | | | |
|---|---|---|---|
| 2013/0170116 A1* | 7/2013 | In | H05K 7/1427 |
| | | | 361/679.01 |
| 2013/0170156 A1* | 7/2013 | Jung | G02F 1/133308 |
| | | | 361/749 |
| 2013/0256671 A1* | 10/2013 | Chen | G02B 6/0091 |
| | | | 257/59 |
| 2014/0103809 A1* | 4/2014 | Bang | H01L 51/529 |
| | | | 315/113 |
| 2014/0211431 A1* | 7/2014 | Um | H04M 1/0266 |
| | | | 361/752 |
| 2015/0085471 A1* | 3/2015 | Jeon | G02F 1/133608 |
| | | | 362/97.2 |
| 2016/0147107 A1* | 5/2016 | Cho | G02F 1/133308 |
| | | | 349/58 |
| 2017/0118859 A1* | 4/2017 | Kang | H05K 7/1427 |
| 2017/0344053 A1* | 11/2017 | Kim | G06F 1/1637 |
| 2017/0345874 A1* | 11/2017 | Kim | H01L 27/32 |
| 2018/0039136 A1* | 2/2018 | Shim | G02F 1/133615 |
| 2018/0184529 A1* | 6/2018 | Kim | B32B 27/08 |
| 2018/0190916 A1 | 7/2018 | Kim et al. | |
| 2019/0069425 A1* | 2/2019 | Ryu | G02F 1/133308 |
| 2019/0132963 A1* | 5/2019 | Yu | H01L 51/5246 |
| 2020/0280796 A1* | 9/2020 | Lee | H04R 17/00 |

FOREIGN PATENT DOCUMENTS

| | | | | |
|---|---|---|---|---|
| CN | 105991948 A | 10/2016 | | |
| CN | 109714916 A | 5/2019 | | |
| EP | 3 249 452 A1 | 11/2017 | | |
| EP | 2947707 B1 * | 4/2019 | | H01L 51/5237 |
| KR | 101472340 B1 * | 12/2014 | | |
| TW | 201411247 A | 3/2014 | | |

OTHER PUBLICATIONS

Chinese Office Action dated Aug. 13, 2021 issued in corresponding Patent Application No. 202010842316.0 w/English Translation (12 pages).

* cited by examiner

*FIG.10*

| structure | black stain pattern | | |
|---|---|---|---|
| (a) | | Max | 63.8 |
| | | Min | 51.0 |
| | | ΔT | 12.8 |
| | | average | 56.8 |
| (b) | | Max | 37.7 (26.1▼) |
| | | Min | 34.8 (16.2▼) |
| | | ΔT | 2.9 (9.9▼) |
| | | average | 36.3 (20.5▼) |

DISPLAY DEVICE

CROSS-REFERENCE TO RELATED APPLICATIONS

This application claims priorities from Korean Patent Application No. 10-2019-0105237 filed on Aug. 27, 2019 and Korean Patent Application No. 10-2020-0072216 filed on Jun. 15, 2020, which are hereby incorporated by reference in their entirety.

BACKGROUND

Field of the Disclosure

The present disclosure relates to a display device, and more particularly, to a display device in which a display panel is engaged with a back cover such that the display device is provided in a slim flat plate structure.

Description of the Background

An image display that renders various types of information on a screen is a key technology in the age of information and communication. The development trend of image displays is toward more slim, more lightweight, and higher-performance ones. In this context, liquid crystal displays (LCDs) which render images by receiving light from a light source and organic light emitting diode (OLED) displays which are self-luminous and thus obviate the need for a light source unit have attracted much attention as flat displays which are more lightweight and smaller than cathode ray tubes (CRTs).

In these displays, a plurality of pixels are arranged in a matrix to display an image. Each pixel is provided with a light emitting element and a pixel driving circuit including a plurality of transistors driving the light emitting element independently.

Thin and lightweight display panels are a recent active research area. Further, display devices with display panels which are bendable to be curved or which are foldable and non-foldable are being supplied.

However, as a display device becomes small, thin, and slim, a metal or glass back cover is adopted to secure the strength of the display device. As a result, the weight and cost of the display device increase, and the increased weight renders the display device less portable.

SUMMARY

Accordingly, the present disclosure provides a display device which includes a back cover formed of a composite material on the rear surface of a display panel so as to have a less weight, better heat radiation performance, and an increased strength.

In addition, the present disclosure provides a display device including a back cover of which the rear surface structure is improved such that finishing of side surfaces of the display device is facilitate and a slim wall-mounting structure is realized for the display device.

According to an aspect of the present disclosure, a display device includes a display panel, a back cover disposed on a rear surface of the display panel and including a plurality of layers, and a finishing portion disposed to surround at least a part of an outer side surface of the display panel and an outer side surface of the back cover. The back cover includes a first layer positioned on the rear surface of the display panel and disposed in an area including an area overlapping with the display panel, a second layer disposed apart from the first layer to oppose the first layer, and a core disposed between the first layer and the second layer.

The display device may further include a panel adhesive layer disposed between the display panel and the back cover.

The panel adhesive layer may be full-surface attached between the display panel and the back cover.

The display device may further include a resin layer integrally attaching side surfaces of the display panel and the panel adhesive layer, a top surface of the first layer, and a top surface or a side surface of the finishing portion to one another.

In the back cover, the first layer and the second layer may be formed of a metallic material, and the core may be formed of plastic.

The back cover may further include core adhesive layers disposed between the first layer and the core and between the second layer and the core, respectively.

In the back cover, the first layer may be extended longer than the second layer or the core, to form a first extension portion, and a circuit unit may be disposed on a rear surface of the first extension portion.

The display device may further include a cover shield engaged to cover the circuit unit disposed on the rear surface of the first extension portion of the back cover.

The cover shield may include a bent portion bent to contact the circuit unit.

A circuit unit may be disposed in an area in which the first layer of the back cover or the first layer and the core of the back cover are at least partially removed. The circuit unit may be disposed on the rear surface of the display panel, and the second layer may cover the circuit unit.

The second layer may be disposed to contact the circuit unit.

The back cover may include a mounting recess in which the second layer and the core are partially removed, and a mounting portion provided on an installation surface may be inserted into the mounting recess.

The finishing portion may include a finishing frame disposed on a side surface of an end portion of the back cover, and a coupling frame protruding inward from the finishing frame to be inserted into an engagement recess in which the core is partially removed in an end portion of the back cover.

The finishing portion may include sealing portions disposed on a top surface and a bottom surface of the coupling frame, to interfere with facing surfaces of the first layer and the second layer.

The finishing portion may include a film layer on an outer side surface of the finishing frame.

According to another aspect of the present disclosure, a display device includes a display panel, a back cover disposed on a rear surface of the display panel and including a plurality of layers, and a finishing portion disposed to surround at least a part of an outer side surface of the display panel and an outer side surface of the back cover. The back cover includes a first layer disposed on the rear surface of the display panel, a second layer disposed apart from the first layer to oppose the first layer, and a core disposed between the first layer and the second layer. The finishing portion includes a finishing frame disposed on a side surface of an end portion of the back cover, and a coupling frame protruding inward from the finishing frame to be disposed in an engagement portion in which a part of the first layer or a part of the second layer is removed and a part of the core adjacent to the removed layer being one of the first layer and the second layer is removed.

When the part of the second layer is removed, a part of the core may remain between the coupling frame and the first layer, and the thickness of the part of the core may be smaller than a straight-line thickness between the first layer and the second layer.

When the part of the first layer is removed, a part of the core may remain between the coupling frame and the second layer, and the thickness of the part of the core may be smaller than a straight-line thickness between the first layer and the second layer.

The outer side surface of the back cover may be more inward than the outer side surface of the display panel.

An outer side surface of the finishing frame may be aligned with the outer side surface of the display panel.

In a display device according to aspects of the present disclosure, a back cover and a display panel are full-surface attached to each other. Therefore, the heat radiation performance and strength of the display device may be increased.

Further, the strength of the back cover may be secured, while the weight of the back cover is reduced.

Further, structural improvement of the back cover may lead to improvement of the heat radiation structure of a circuit unit and, at the same time, provide a very simple, neat outward appearance to the rear surface of the back cover.

Further, a wall-mount structure may be provided without any additional component by the rear surface of the back cover.

Further, the back cover is easily engaged with a finishing portion, thereby facilitating assembly.

BRIEF DESCRIPTION OF THE DRAWINGS

The above and other objects, features, and advantages of the present disclosure will be more clearly understood from the following detailed description, taken in conjunction with the accompanying drawings, in which:

FIGS. 10 and 11 are graphs illustrating temperature changes according to attachment structures between a display panel and the back cover in the display device according to aspects of the present disclosure;

DETAILED DESCRIPTION

Figure 1:
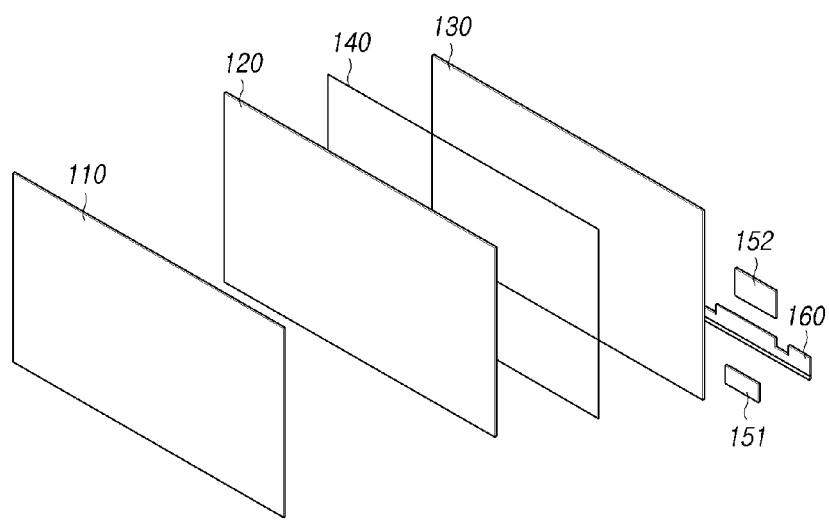
FIG. 1 is an exploded perspective view illustrating a display device according to the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. It should be noted that the accompanying drawings are provided in a very simplified form and not necessarily presented to exact scale, with the only intention to facilitate convenience and clarity in explaining the purpose of the present disclosure. Those skilled in the art will readily understand these specific details.

In the present disclosure, the term "display device" may encompass display devices in a narrow sense, such as a liquid crystal module (LCM) including a display panel and a driver driving the display panel, an organic light emitting diode (OLED) module, a quantum-dot light emitting diode (QLED) module, and an inorganic light emitting diode (LED) module. The term "display device" may also encompass set electronic devices or set devices or apparatuses, such as a laptop computer, a television, a computer monitor, an equipment display (e.g., an automotive display or other types of vehicle displays), or a mobile electronic device like a smart phone or an electronic pad, which is a complete or finished product including an LCM, an OLED module, a QLED module, an LED module, and so on.

FIG. 1 is an exploded perspective view illustrating a display device 100 according to aspects of the present disclosure.

Referring to FIG. 1, the display device 100 according to aspects of the present disclosure includes a display panel 110 displaying an image, a panel adhesive layer 120 disposed on the rear surface of the display panel 110, and a back cover 130.

The display panel 110 may be a flexible display panel which is curved or bendable, or a rigid flat display panel which is not deformable against external force in a flat state.

The flexible display panel, which is the display panel 110 with flexibility, may be implemented as an inorganic electroluminescence display, an OLED display, or an electroluminescence display such as a QLED display. The flexible display panel may also be implemented as an electrophoretic display or an electrochromic display (ECD).

For example, when the display panel 110 is an LCD panel, the display panel 110 includes a plurality of gate lines, a plurality of data lines, and pixels at the intersections between the gate lines and the data lines. Further, the display panel 110 may include an array substrate with thin-film transistors which are switching devices for controlling the light transmittance of each pixel, an upper substrate with color filters and/or black matrices, and a liquid crystal layer formed between the array substrate and the upper substrate.

When the display panel 110 is an electroluminescence display panel, the display panel 110 may include a plurality of gate lines, a plurality of data lines, and pixels at the intersections between the gate lines and the data lines. Further, the display panel 110 may include an array substrate with thin-film transistors which are devices for selectively applying a voltage to each pixel, an LED layer on the array substrate, and an encapsulation substrate disposed on the array substrate, to cover the LED layer. The encapsulation layer may protect thin-film transistors and the LED layer against external impacts and prevent introduction of moisture or oxygen into the LED layer.

The LED layer formed on the array substrate may include an organic light emitting layer or an inorganic light emitting layer. The inorganic light emitting layer may include, for example, a nano-sized material layer or quantum dots.

The following description will be given in the context of the display panel 110 being an electroluminescence display panel, by way of example, The display panel 110 may include a display area displaying a screen and a non-display area located close to the display area. For example, the display panel 110 may include a display area displaying a screen and a non-display area defined around the display area.

A touch film (not shown) may be provided on the display panel 110. The touch film may be attached on the display panel 110 by means of an adhesive layer. A viscose adhesive such as an optical clearance adhesive (OCA) may be applied to the adhesive layer. Further, a cover window, a protection film, an optical sheet, and so on may further be provided on the touch film. For example, the cover window may be formed of a plastic material having flexibility. The plastic material may include polyimide (PI), polyethylene terephthalate (PET), polyethylene naphthalate (PEN), polycarbonate (PC), polyethersulfone (PES), polyarylate (PAR), polysulfone (PSF), cyclic-olefin copolymer (COC), and so on.

At least one of a first and a second circuit units 151 and 152 may be disposed on the rear surface of the back cover 130. A cover shield 160 may be disposed to cover at least one of the first and second circuit units 151 and 152 disposed on the rear surface of the back cover 130.

For example, the first circuit unit 151 may be a driving circuit that drives the data lines disposed on the display panel 110. The cover shield 160 may be disposed to cover the first circuit unit 151.

The second circuit unit 152 may be, for example, a control printed circuit board (PCB) on which a controller controlling the driving circuit is mounted. The second circuit unit 152 may be positioned on the rear surface of the back cover 130, in an area which is not covered by the cover shield 160.

Figure 2:
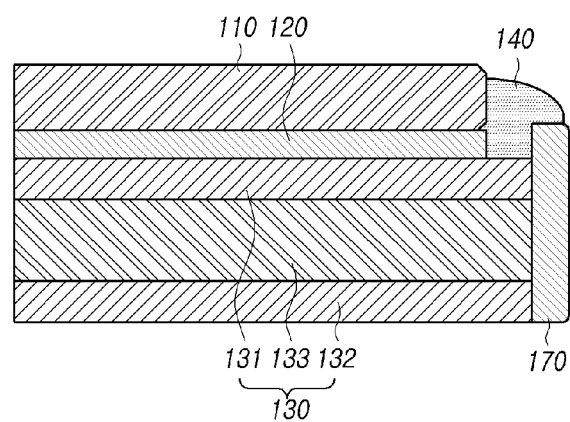
FIG. 2 is a cross-sectional view illustrating a side surface area of the display device to which a back cover illustrated in FIG. 1 is applied.
Figure 3:
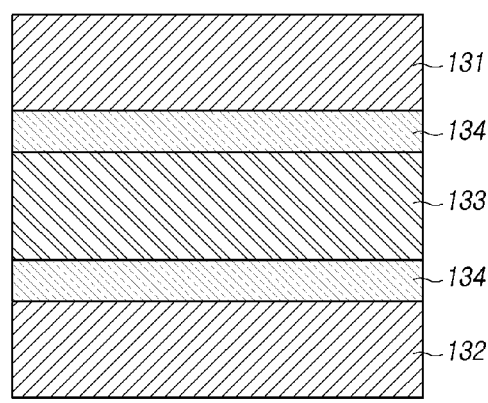
FIG. 3 is an enlarged cross-sectional view illustrating the back cover illustrated in FIG. 2.

FIG. 2 is a cross-sectional view illustrating a side surface area of the display device 100 to which the back cover 130 illustrated in FIG. 1 is applied, specifically a side surface area in which the first and second circuit units 151 and 152 are not disposed. FIG. 3 is an enlarged cross-sectional view illustrating the back cover 130 illustrated in FIG. 2.

Referring to FIGS. 2 and 3, the panel adhesive layer 120 may be interposed between the display panel 110 and the back cover 130. The display panel 110 and the back cover 130 may be attached to each other by the panel adhesive layer 120. For example, the panel adhesive layer 120 may be a double-sided tape. Obviously, the material of the panel adhesive layer 130 is not limited to a double-sided tape. The panel adhesive layer 120 may be a foam tape, bonding, or a plastic composite sheet (PCS).

The panel adhesive layer 120 between the display panel 110 and the back cover 130 may be disposed over the full surface of the display panel 110. Therefore, the back cover 130 may be attached on the full surface of the display panel 110 by the panel adhesive layer 120 disposed on the full surface of the display panel 110. When the back cover 130 is attached on the full surface of the display panel 110 by the panel adhesive layer 120, the resulting increased heat conductivity between the display panel 110 and the back cover 130 may lead to improvement of the heat radiation effect. The improvement of the heat radiation performance brought by the full-surface attachment of the panel adhesive layer 120 between the display panel 110 and the back cover 130 will be described later in greater detail.

The back cover 130 may be configured as a stack of a plurality of layers. The back cover 130 may include a first layer 131, the second layer 132, and a core 133.

The first layer 131 may be disposed on the rear surface of the display panel 110, in full-surface attachment to the display panel 110.

The second layer 132 is spaced from the first layer 131, opposing the first layer 131. The first layer 131 and the second layer 132 may be formed of the same material in the shape of thin plates. The first layer 131 and the second layer 132 may be formed of a metallic material having high heat conductivity. For example, the first layer 131 and the second layer 132 may be formed of aluminum.

The core 133 may be interposed between the first layer 131 and the second layer 132. The core 133 may be formed of plastic. For example, the core 133 may be formed of polyethylene (PE), polypropylene (PP), or the like as plastic. Alternatively, the core 133 may be formed of a chemical compound including a polymer resin layer. For example, the core 133 may be formed of a mixture of magnesium hydroxide, ethylene vinyl acetate (EVA), and PE.

Core adhesive layers 134 may be provided respectively between the first layer 131 and the core 133 and between the second layer 132 and the core 133. The core adhesive layers 134 may be full-surface attached between the first layer 131 and the core 133 and between the second layer 132 and the core 133, thus attaching the first layer 131 to the core 133 and the second layer 132 to the core 133. For example, bonding, hot melt, or double-sided tapes may be applied to replace the core adhesive layers 134.

Figure 4A:
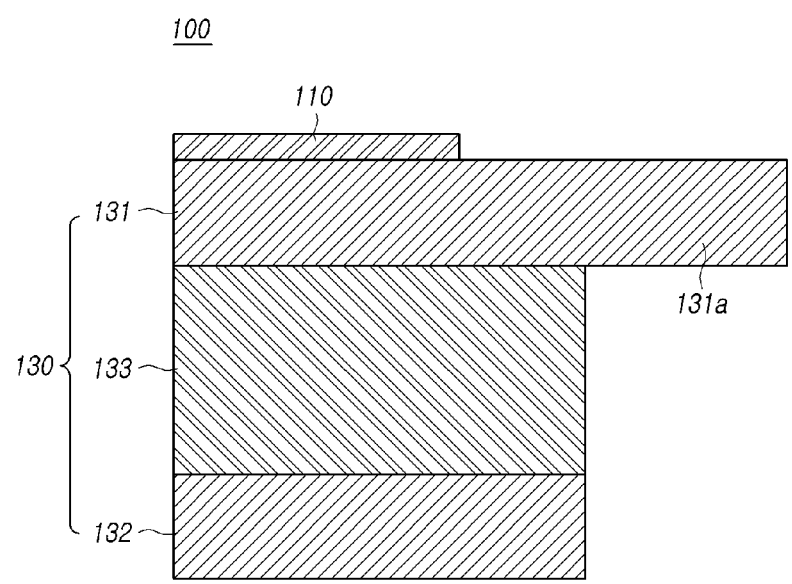
FIG. 4A is a cross-sectional view illustrating an exemplary structure of the back cover according to the present disclosure.
Figure 4B:
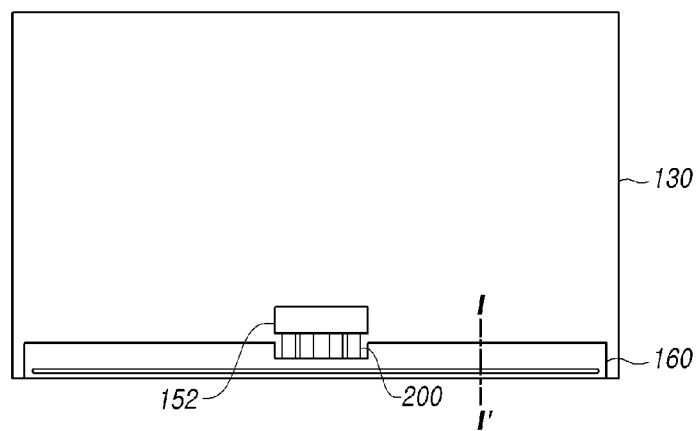
FIGS. 4B and 4C are diagrams illustrating an exemplary structure of the display device to which the back cover illustrated in FIG. 4A is applied.
Figure 4C:
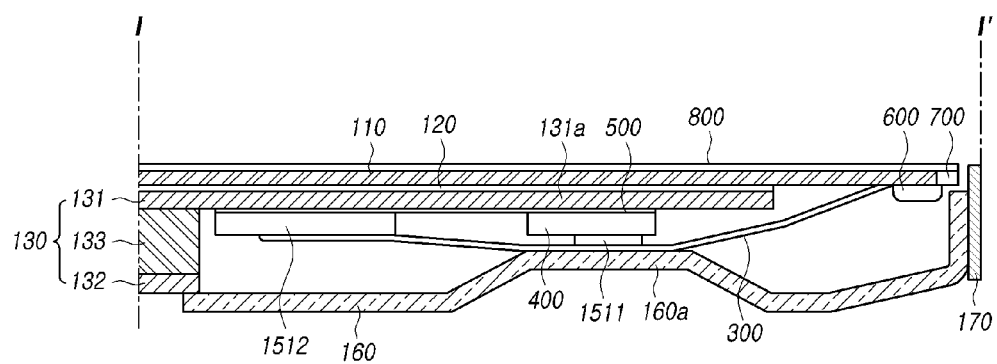

FIG. 4A is a cross-sectional view illustrating an exemplary structure of the back cover 130 according to aspects of the present disclosure. FIGS. 4B and 4C are diagrams illustrating an exemplary structure of the display device 100 to which the back cover 130 illustrated in FIG. 4A is applied. FIG. 4B illustrates the rear surface of the display device 100, and FIG. 4C illustrates the cross-section structure of a part I-I' illustrated in FIG. 4B.

Referring to FIGS. 4A, 4B and 4C, the back cover (an inner type) 130 according to aspects of the present disclosure includes the first layer 131, the second layer 132, and the core 133.

The first layer 131 may be disposed on the rear surface of the display panel 110. A panel adhesive layer (not shown) may be interposed between the rear surface of the display panel 110 and the first layer 131. The second layer 132 may be disposed, facing the first layer 131. The core 133 is interposed between the first layer 131 and the second layer 132. Core adhesive layers (not shown) may be provided on the top surface and bottom surface of the core 133.

The first layer 131 may be extended longer than the second layer 132 and the core 133. Alternatively, only the first layer 131 may be extended into a first extension portion 131a, with the second layer 132 and the core 133 removed in the multi-layer back cover 130.

At least one of circuit units arranged on the rear surface of the back cover 130 may be disposed on the rear surface of the first extension portion 131a. The circuit unit disposed on the rear surface of the first extension portion 131a may be covered by the cover shield 160.

Referring to FIG. 4B, the second circuit unit 152 such as a control PCB may be disposed on the rear surface of the back cover 130. The second circuit unit 152 may be coupled to the first circuit unit 151 covered by the cover shield 160 through a flexible printed circuit 200.

Referring to FIG. 4C, at least one first circuit unit 151 may be interposed between the first extension portion 131a of the back cover 130 and the cover shield 160. For example, a data driving circuit 1511 disposed on a flexible film 300 may be interposed between the first extension portion 131a and the cover shield 160. Further, a source PCB 1512 may be interposed between the first extension portion 131a and the cover shield 160.

A pad portion 400 may be interposed between the data driving circuit 1511 and the first extension portion 131a. The pad portion 400 and the source PCB 1512 may be attached to the first extension portion 131a by an adhesive tape 500.

Alternatively, at least one first circuit unit 151 may be disposed on the rear surface of the second layer 132 of the back cover 130 in some cases. Because the second layer 132 may be formed of the same metallic material as the first layer 131, excellent heat radiation characteristics may be provided even when the first circuit unit 151 is disposed on the rear surface of the second layer 132. When all first circuit units 151 are arranged on the rear surface of the second layer 132, the first extension portion 131a of the first layer 131 may not be formed.

The cover shield 160 may be formed into a lid that covers the first circuit unit 151. The cover shield 160 may include a bent portion 160a protruding in correspondence with at least one first circuit unit 151. For example, the bent portion 160a may be formed by bending a part of the cover shield 160 to support the rear surface of the data driving circuit 1511. The bent portion 160a provides the effect of inducing heat radiation in direct contact with the data driving circuit 1511.

A finishing portion 170 may be disposed on one side surface of the cover shield 160. The other side surface of the cover shield 160 may contact at least a part of the second layer 132 and the core 133 of the back cover 130.

A flexible film protector 600 may be disposed to fix the flexible film 300 at a periphery of the rear surface of the display panel 110. A side sealing portion 700 may be disposed on a side surface of the display panel 110. A polarization plate 800 may be disposed on the front surface of the display panel 110.

As a part of the back cover 130 is removed and the first circuit unit 151 is disposed in the removed part, the display device 100 may be less thick and have improved heat radiation characteristics.

Alternatively, a structure without the cover shield 160 may be provided by covering the area in which the first circuit unit 151 is disposed with the back cover 130.

Figure 5A:
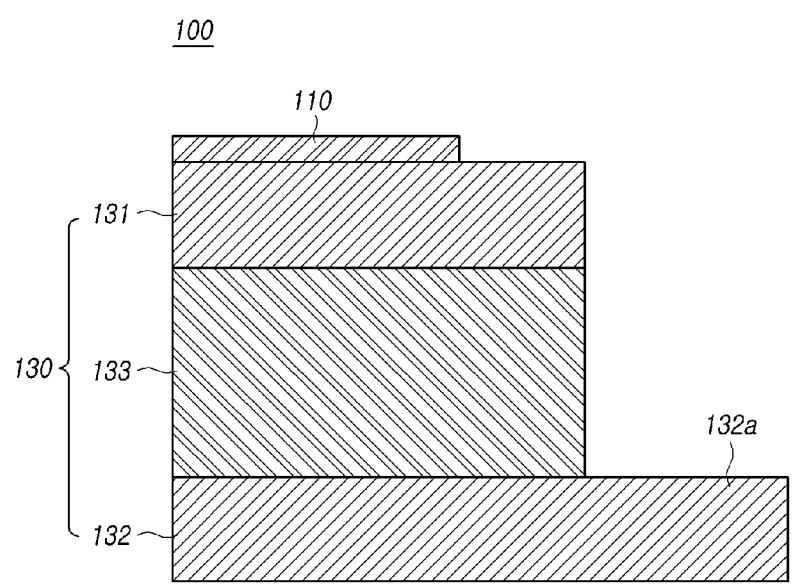
FIG. 5A is a cross-sectional view illustrating another exemplary structure of the back cover according to the present disclosure.
Figure 5B:
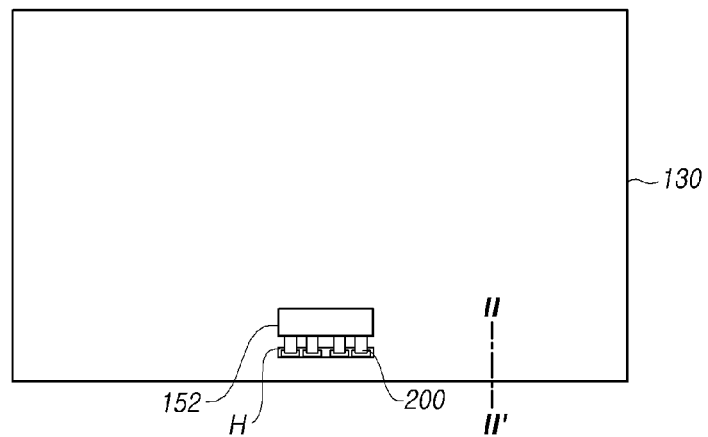
FIGS. 5B and 5C are diagrams illustrating an exemplary structure of the display device to which the back cover illustrated in FIG. 5A is applied.
Figure 5C:
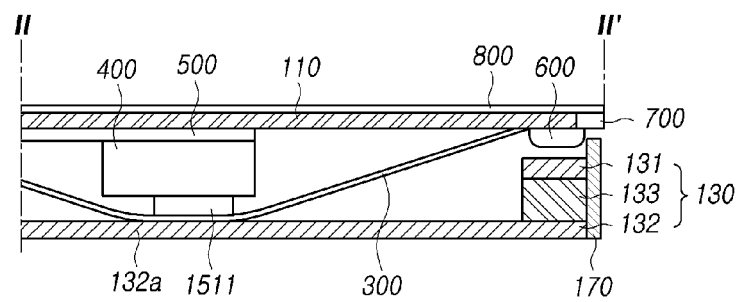

FIG. 5A is a cross-sectional view illustrating another exemplary structure of the back cover 130 according to aspects of the present disclosure. FIGS. 5B and 5C are diagrams illustrating an exemplary structure of the display device 100 to which the back cover 130 illustrated in FIG. 5A is applied. FIG. 5B illustrates the rear surface of the display device 100, and FIG. 5C illustrates the cross-section structure of a part II-II' illustrated in FIG. 5B.

Referring to FIGS. 5A, 5B and 5C, the back cover (an outer type) 130 according to other aspects of the present disclosure include the first layer 131, the second layer 132, and the core 133.

The first layer 131 may be disposed on the rear surface of the display panel 110. A panel adhesive layer (not shown) may be interposed between the rear surface of the display panel 110 and the first layer 131. The second layer 132 may be disposed apart from the first layer 131, facing the first layer 131. The core 133 is interposed between the first layer 131 and the second layer 132. Core adhesive layers (not shown) may be provided on the top surface and bottom surface of the core 133.

The second layer 132 may be extended longer than the first layer 131 and the core 133. Alternatively, as the first layer 131 and the core 133 are removed in the multi-layer back cover 130, only the second layer 132 may remain as a second extension position 132a. Alternatively, the second extension portion 132a may be formed, with the core 133 and the second layer 132 still remaining.

The second extension portion 132a of the back cover 130 may be disposed in correspondence with the data driving circuit 1511 disposed on the rear surface of the display panel 110. The second extension portion 132a may support the data driving circuit 1511, contacting the data driving circuit 1511 on the inner surface thereof.

That is, the first circuit unit 151 such as the data driving circuit 1511 may be disposed in an area from which the first layer 131 and the core 133 have been removed. Because the first circuit unit 151 contacts the second layer 132 formed of a metallic material, excellent heat radiation characteristics may be provided.

The first layer 131 and the core 133 may still remain in an area other than the area in which the first circuit unit 151 is disposed. Accordingly, the display panel 110 may be supported by the first layer 131.

The second circuit unit 152 may be disposed on the rear surface of the back cover 130. When the second circuit unit 152 is disposed on the rear surface of the back cover 130, the second circuit unit 152 may be electrically coupled to the first circuit unit 151 inside the back cover 130 through the flexible printed circuit 200 passing through holes H formed into the back cover 130.

As such, the second layer 132 covers the whole periphery of the rear surface of the display device 100 including the area in which the first circuit unit 151 is disposed. Therefore, the rear surface of the display device 100 may have a simple outward appearance without any protrusion.

Further, since the first layer 131, the core 133, and the second layer 132 are stacked without any removed part in one side end portion of the back cover 130, the finishing portion 170 is easily engaged with the back cover 130, which will be described later in greater detail.

Figure 6:
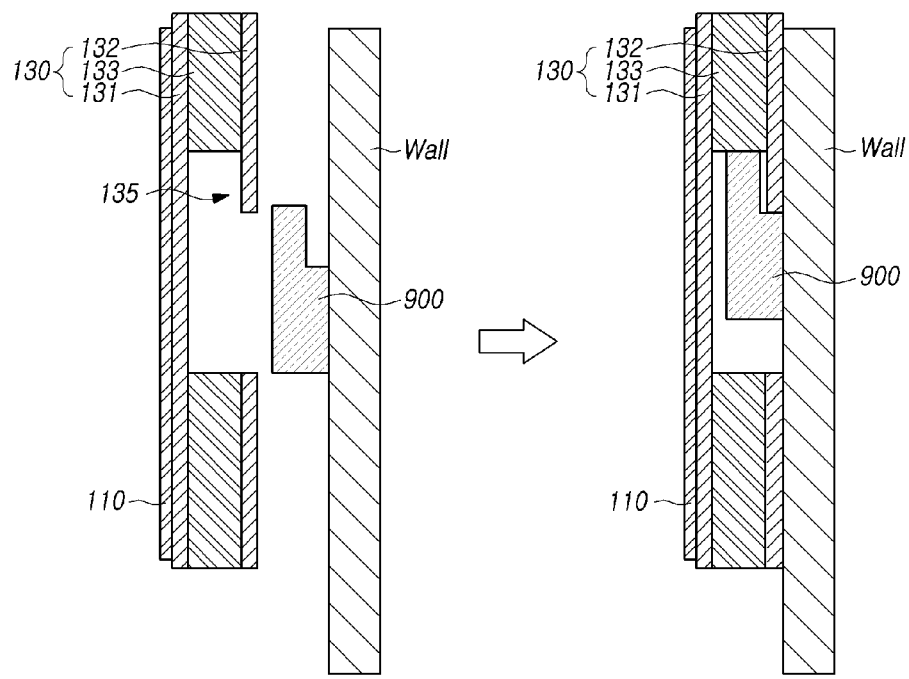
FIG. 6 is a cross-sectional view illustrating another exemplary structure of the back cover and an exemplary structure of the display device to which this back cover is applied.

FIG. 6 is a cross-sectional view illustrating another exemplary structure of the back cover 130 and an exemplary structure of the display device 100 to which this back cover 130 is applied according to aspects of the present disclosure.

Referring to FIG. 6, the back cover 130 according to aspects of the present disclosure includes the first layer 131, the second layer 132, and the core 133.

The first layer 131 is disposed on the rear surface of the display panel 110. A panel adhesive layer (not shown) may be interposed between the rear surface of the display panel 110 and the first layer 131. The second layer 132 is disposed, facing the first layer 131. The core 133 is interposed between the first layer 131 and the second layer 132. Core adhesive layers (not shown) may be provided on the top surface and bottom surface of the core 133.

As described before, when the back cover 130 covers the entire rear surface of the display panel 110, a lightweight and thin structure may be provided. Further, the rear surface of the back cover 130 without any additional protruding component may provide a simple rear-surface design.

As illustrated in the example of FIG. 6, the second layer 132 and the core 133 may be partially removed to allow the display device 100 to be mounted on a wall.

The second layer 132 may first be removed partially from the rear surface of the back cover 130 and then the core 133 may be removed deeper in a coupling direction inside the second layer 132, so that a mounting recess 135 may be formed, into which a mounting portion 900 provided on an installation surface (e.g., a wall) is inserted. For example, after the mounting portion 900 shaped into a hook is installed on the wall and engaged with the mounting recess 135, the display device 100 may be lowered. Then, the display device 100 may be fixed to the mounting portion 900 by its self-weight and thus mounted on the wall. Therefore, there is no need for providing an additional reinforcement or mounting means on the rear surface of the display device 100 to mount the display device 100 on a wall, and thus a cheap, easily wall-mountable structure may be provided.

A plurality of mounting portions 900 and a plurality of mounting recesses 135 may be engaged with each other depending on the size, weight center, and installation position of the display device 100.

Figure 7A:
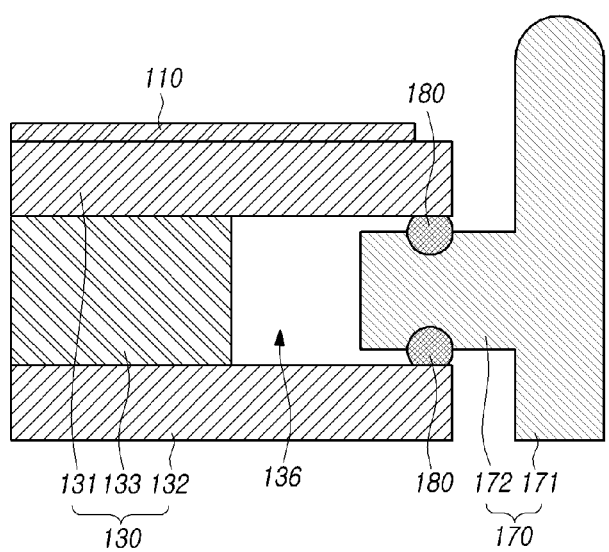
FIGS. 7A, 7B, and 7C are cross-sectional views illustrating exemplary structures of a finishing portion provided on a side surface of the back cover according to the present disclosure.
Figure 7B:
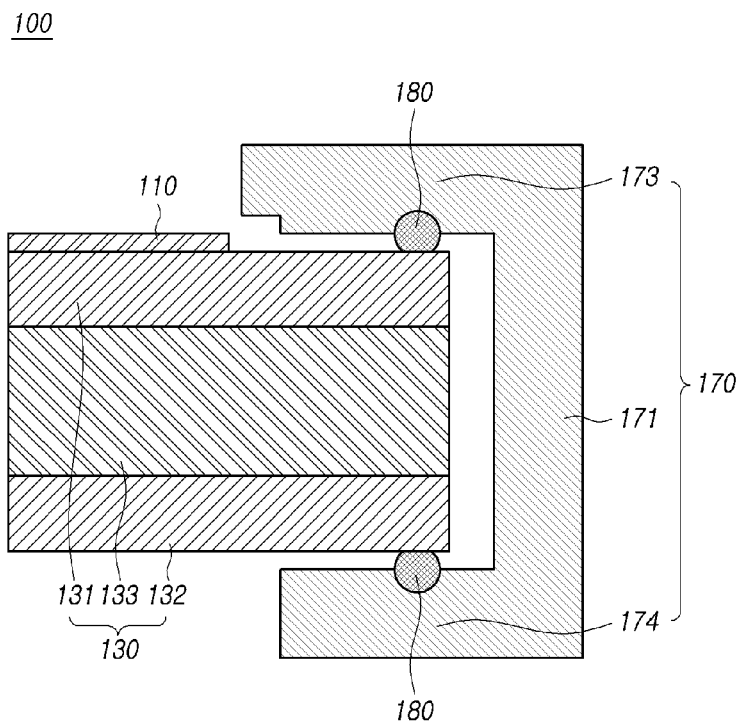
Figure 7C:
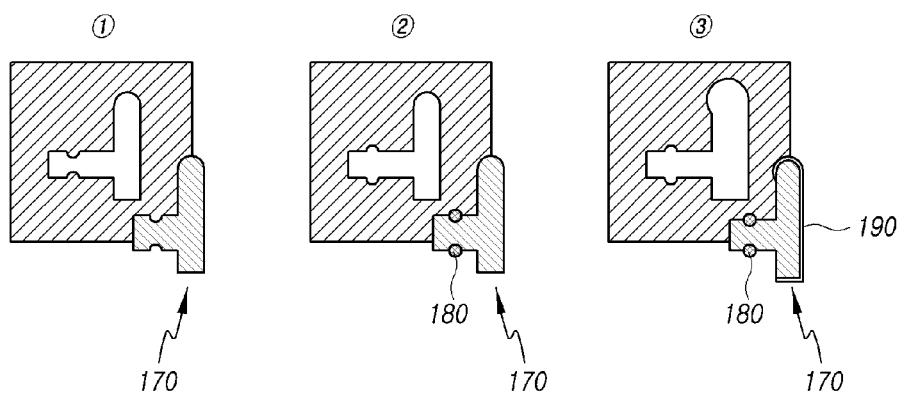

FIGS. 7A, 7B and 7C are cross-sectional views illustrating exemplary structures of the finishing portion 170 provided on a side surface of the back cover 130 according to the present disclosure.

Referring to FIGS. 7A, 7B and 7C, the finishing portion 170 is engaged with a peripheral area of the back cover 130 according to aspects of the present disclosure.

The cross-section of the finishing portion 170 illustrated in FIG. 7A may be shaped into "T". The finishing portion 170 includes a finishing frame 171 disposed on a side surface of an end portion of the back cover 130 and a coupling frame 172 protruding from the finishing frame 171 and inserted into the back cover 130.

The finishing frame 171 is disposed to surround the side surface of the back cover 130 or the display panel 110, forming the exterior. The finishing frame 171 may give various outward looks to the display device 100, with the help of a configured design, pattern, or color.

The coupling frame 172 may be integrally formed with the finishing frame 171. As the coupling frame 172 is inserted into an engagement recess 136 formed into the back cover 130, the finishing portion 170 is engaged with the back cover 130.

The engagement recess 136 may be formed by partially removing the core 133 of the back cover 130.

Sealing portions 180 may be provided on the outer circumferential surface of the coupling frame 172. The sealing portions 180 are provided on one or both of the top and bottom surfaces of the coupling frame 172 and disposed to interfere with facing surfaces of the first layer 131 and the second layer 132. The sealing portions 180 may be formed by double extrusion in the process of molding the coupling frame 172.

The finishing portion 170 may be formed of a metallic or plastic material, or acrylonitrile butadiene styrene (ABS), and the sealing portions 180 may be fabricated by double extrusion and applied to the finishing portion 170. The sealing portions 180 may be formed of silicone.

Obviously, a resin layer 140 (in FIG. 2) may further be provided in an area in which the back cover 130 and the finishing portion 170 are arranged close to each other in the peripheral area of the display panel 110.

FIG. 7B illustrates the finishing portion 170 in a different shape from that illustrated in FIG. 7A. The finishing portion 170 may be shaped into "C". The finishing portion 170 includes the finishing frame 171 disposed on a side surface of an end portion of the back cover 130, a top frame 173 protruding from the top end of the finishing frame 171 to overlap partially with the top surface of the back cover 130 or the top surface of the display panel 110, and a bottom frame 174 protruding from the bottom end of the finishing frame 171 toward the bottom surface of the back cover 130, to oppose the top frame 173.

The finishing portion 170 is engaged to surround whole peripheral areas of the back cover 130 and the display panel 110. The sealing portions 180 may be provided on facing surfaces of the top frame 173 and the bottom frame 174, to interfere with the back cover 130.

Therefore, the display device 100 according to aspects of the present disclosure is provided with the finishing portion 170 along the peripheries of the display panel 110 and the back cover 130, thereby increasing impact resistance. Further, the finishing portion 170 advantageously reinforces the strength of the display device 100.

FIG. 7C is an exemplary diagram illustrating double extrusion of the finishing portion 170.

As illustrated in ① of FIG. 7C, the finishing portion 170 is molded by extrusion (e.g., ABS extrusion).

As illustrated in ② of FIG. 7C, the finishing portion 170 is double-extruded again together with the sealing portions 180 on the finishing portion 170. Then, the finishing portion 170 and the sealing portions 180 of different materials are completely molded into one component.

As illustrated in ③ of FIG. 7C, a film layer 190 is attached on the outer surface of the completely molded finishing portion 170 illustrated in ② of FIG. 7C. As a color or a design pattern in the display device 100 is provided on the film layer 190, the film layer 190 may advantageously enhance the outward appearance of the display device 100. Obviously, the film layer 190 may be a transparent protection film with no color or design pattern.

FIGS. 8A, 8B, 8C, and 8D are cross-sectional views illustrating other exemplary structures of the finishing portion 170 provided on a side surface of the back cover 130 according to the present disclosure.

Figure 8A:
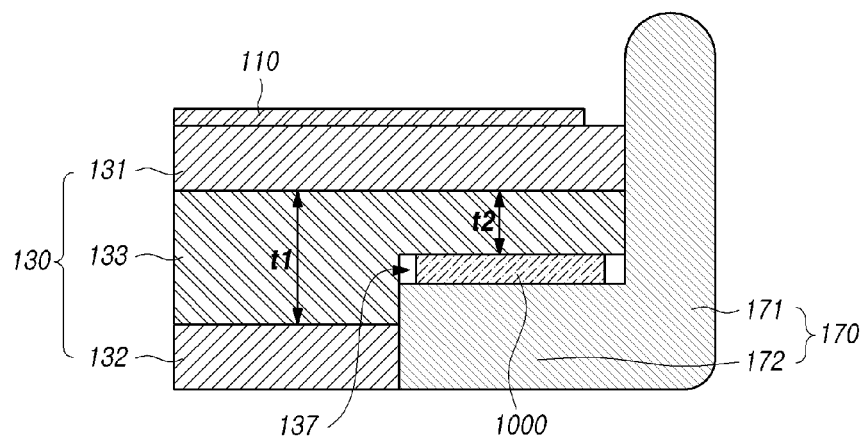
FIGS. 8A, 8B, 8C, and 8D are cross-sectional views illustrating other exemplary structures of the finishing portion provided on a side surface of the back cover according to the present disclosure.

Referring to FIG. 8A, the back cover 130 according to aspects of the present disclosure includes the first layer 131, the second layer 132, and the core 133.

The second layer 132 may be partially removed from an end portion of the back cover 130. The core 133 may also be partially removed from the end portion of the back cover 130. The removed part of the core 133 may be close to the second layer 132. That is, the part of the second layer 132 and the part of the core 133 adjacent to the second layer 132 may be removed.

An engagement portion 137 may be formed in the areas from which the second layer 132 and the core 133 have been removed.

The finishing portion 170 may be disposed outside the back cover 130 and in the engagement portion 137 of the back cover 130.

The finishing portion 170 may include the finishing frame 171 positioned on a side surface of the end portion of the back cover 130 and the coupling frame 172 protruding from the finishing frame 171 and disposed in the engagement portion 137. That is, the finishing portion 170 may be shaped into "∟" as illustrated in FIG. 8A.

The coupling frame 172 of the finishing portion 170 may be engaged with the back cover 130 by an adhesive portion 1000. For example, after the adhesive portion 1000 is disposed on the core 133 of the back cover 130, the finishing portion 170 may be disposed in the engagement portion 137, thus being engaged with the back cover 130.

For example, the adhesive portion 1000 may be, but not limited to, a double-sided tape or resin. While the adhesive portion 1000 is shown in FIG. 8A as being disposed only on the top surface of the coupling frame 172 by way of example, the adhesive portion 1000 may further be disposed on a side surface of the coupling frame 172 in some cases.

As the finishing portion 170 is engaged with the back cover 130 by the engagement portion 137 from which the part of the second layer 132 and the part of the core 133 have been removed in the end portion of the back cover 130, the finishing portion 170 may be easily assembled.

Further, because the finishing portion 170 is engaged in the engagement portion 137 from which the part of the second layer 132 has been completely removed, the display panel 110 may be easily disposed in the structure in which the finishing portion 170 is engaged with the end portion of the back cover 130.

That is, because much impact is not imposed on the display panel 110 in the assembly process of the finishing portion 170, the finishing portion 170 may be engaged, with the display panel 110 disposed on the back cover 130. Alternatively, after the finishing portion 170 is engaged with the back cover 130, the display panel 110 may be disposed on the back cover 130 in some cases. Accordingly, processing efficiency may be improved by selecting a fabrication process as needed.

As described before, the engagement portion 137 of the back cover 130 may be formed by removing a part of the second layer 132 and a part of the core 133 adjacent to the second layer 132. The part of the core 133 may be removed from the end portion of the back cover 130, with the other part of the core 133 remaining in the back cover 130.

Therefore, the core 133 may be positioned between the coupling frame 172 of the finishing portion 170 and the first layer 131 in the end portion of the back cover 130.

The thickness t2 of the part of the core 133 between the first layer 131 and the coupling frame 172 may be smaller than the total thickness t1 of the core 133. That is, the thickness t2 may be smaller than the straight-line distance between the first layer 131 and the second layer 132.

As the part of the core 133 adjacent to the second layer 132 is removed but the core 133 still remains between the coupling frame 172 and the first layer 131, the engagement portion 137 may be formed into a shape that facilitates engagement and maintains the strength.

Further, the engagement of the coupling frame 172 may be facilitated by the adhesive portion 1000 by bringing the core 133 formed of plastic into contact with the adhesive portion 1000 being a double-sided tape or resin.

Although the top end of the finishing frame 171 of the finishing portion 170 may be positioned higher than the display panel 110 as illustrated in FIG. 8A, the top end of the finishing frame 171 may be positioned lower than the display panel 110 in some cases.

Figure 8B:
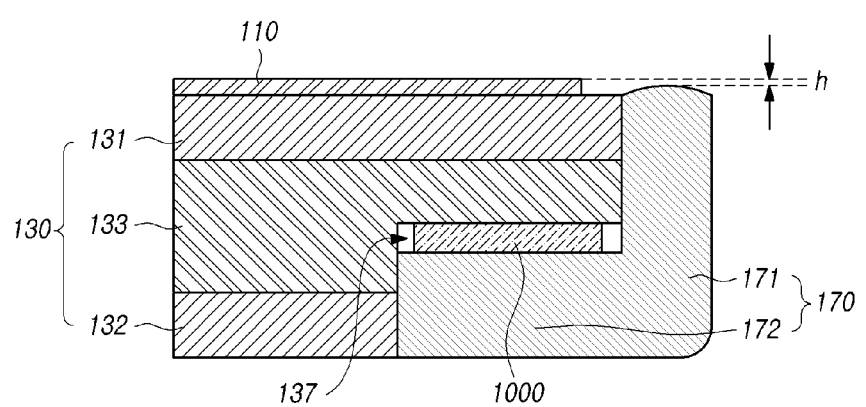

Referring to FIG. 8B, the back cover 130 may include the engagement portion 137 from which a part of the second layer 132 and a part of the core 133 adjacent to the second layer 132 have been removed. The finishing portion 170 may be positioned in an end portion of the back cover 130 and include the finishing frame 171 and the coupling frame 172.

The top end of the finishing frame 171 may be positioned lower than the top surface of the display panel 110. For example, the vertical distance between the top end of the finishing frame 171 and the top surface of the display panel 110 may be h.

Alternatively, the top end of the finishing frame 171 may be positioned on the same plane as the top surface of the first layer 131 of the back cover 130 in some cases. Alternatively, the top end of the finishing frame 171 may be connected to the top surface of the first layer 131, slowly being lowered than the top surface of the first layer 131. That is, the top end of the finishing frame 171 may be positioned on the same plane as or lower than the bottom surface of the display panel 110.

As the top end of the finishing frame 171 is positioned lower than the top surface of the display panel 110, the peripheral area of the display device 100 may have smooth outward looks.

As the top end of the finishing frame 171 is positioned lower than the top surface of the display panel 110, the afore-described resin layer 140 may be disposed on a side surface of the display panel 110. That is, the resin layer 140 may be disposed between the display panel 110 and the finishing portion 170, surrounding the side surface of the display panel 110.

Alternatively, when the display panel 110 is subjected to a cutting process, the display panel 110 may be cut from the top surface to the bottom surface, thereby forming the side surfaces of the display panel 110 to be smooth. In this case, the resin layer 140 may not be disposed between the display panel 110 and the finishing portion 170.

As such, the finishing portion 170 is engaged with the back cover 130 by the engagement portion 137 formed by removing a part of the second layer 132 and a part of the core 133 in the back cover 130. Therefore, the engagement process of the finishing portion 170 may be facilitated and the peripheral area of the display device 100 may have a clean outward appearance.

Further, the engagement portion 137 may be formed by removing a part of the first layer 131 and a part of the core 133 in the back cover 130 in some cases.

Figure 8C:
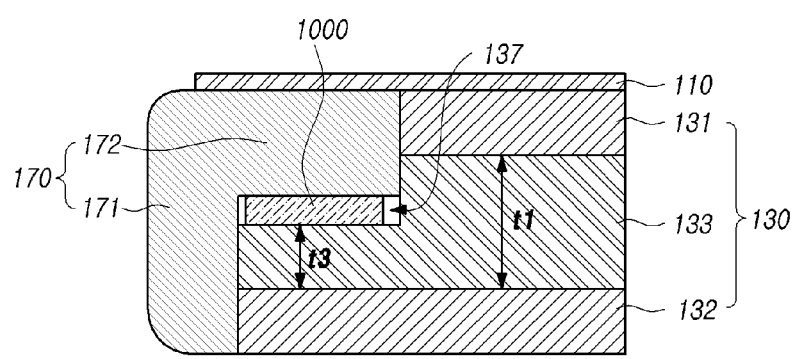

Referring to FIG. 8C, a part of the first layer 131 may be removed from an end portion of the back cover 130. Further, a part of the core 133 adjacent to the first layer 131 may be removed.

The area from which the first layer 131 is partially removed may be continuous to the area from which the core 133 is partially removed. The areas from which the first layer 131 and the core 133 are partially removed may define the engagement portion 137.

A part of the core 133 may remain between the engagement portion 137 and the second layer 132. As illustrated in FIG. 8C, the thickness t3 of the part of the core 133 remaining between the engagement portion 137 and the second layer 132 may be smaller than the total thickness t1 of the core 133. That is, the thickness t3 of the part of the core 133 remaining between the engagement portion 137 and the second layer 132 may be smaller than the straight-line distance between the first layer 131 and the second layer 132.

As the core 133 remains between the engagement portion 137 and the second layer 132, the engagement portion 137 may be formed, while the strength of the back cover 130 is maintained.

The finishing portion 170 may be disposed outside the back cover 130.

The finishing portion 170 may include the finishing frame 171 positioned to surround the outer surface of the back cover 130 and the coupling frame 172 protruding from the finishing frame 171 and disposed in the engagement portion 137. That is, the finishing portion 170 may be shaped into "]" as illustrated in FIG. 8C.

The coupling frame 172 of the finishing portion 170 may be attached by the adhesive portion 1000 disposed on the core 133 of the back cover 130. Therefore, the finishing portion 170 may be engaged with the back cover 130 through the engagement portion 137.

The display panel 110 may be positioned on the first layer 131 of the back cover 130. As the finishing portion 170 is engaged in a structure in which the first layer 131 and the core 133 are partially removed in an end portion of the back cover 130, a part of the display panel 110 may be positioned on the finishing portion 170.

In this case, after the finishing portion 170 is engaged in the engagement portion 137 of the back cover 130, the display panel 110 may be disposed on the back cover 130 and the finishing portion 170. That is, with the back cover 130 and the finishing portion 170 integrally formed with each other, the display panel 110 may just be disposed, for assembly.

When the display panel 110 is disposed on the finishing portion 170 with a side surface of the display panel 110 exposed, the resin layer 140 may be disposed on the side surface of the display panel 110 and the finishing portion 170.

Alternatively, the side surfaces of the display panel 110 may be rendered smooth by cutting the display panel 110 from the top surface to the bottom surface, as described before. Therefore, even though the display panel 110 is positioned on the finishing portion 170, the display panel 110 may have a clean outward appearance without an additional component such as the resin layer 140 on the side surface of the display panel 110.

Further, when the display panel 110 is positioned on the finishing portion 170, the bezel of the display device 100 may be minimized by positioning an outer side surface of the finishing portion 170 close to an outer side surface of the display panel 110.

Figure 8D:
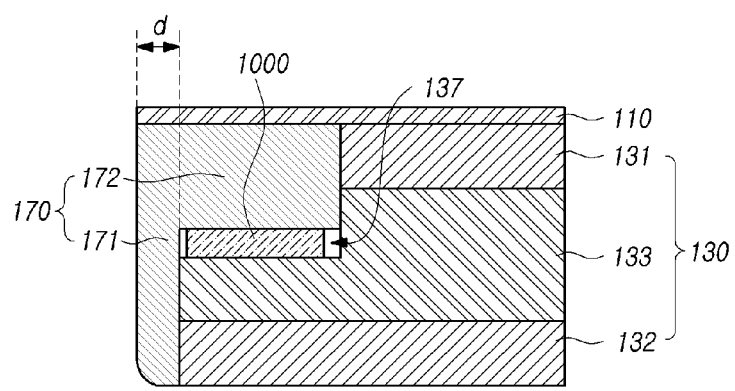

Referring to FIG. 8D, the engagement portion 137 may be formed by removing a part of the first layer 131 and a part of the core 133 in an end portion of the back cover 130. The core 133 may remain between the engagement portion 137 and the second layer 132.

The finishing portion 170 including the finishing frame 171 and the coupling frame 172 may be engaged in the engagement portion 137 of the back cover 130. Therefore, a part of the core 133 may be positioned between the coupling frame 172 and the second layer 132.

An outer side surface of the back cover 130 may be positioned more inward than an outer side surface of the display panel 110. For example, the distance between the outer side surface of the back cover 130 and the outer side surface of the display panel 110 may be d.

Because the outer side surface of the back cover 130 is positioned more inward than the outer side surface of the display panel 110, a space may be secured, in which the finishing frame 171 of the finishing portion 170 positioned on the outer side surface of the back cover 130 may be disposed.

Therefore, the distance between the outer side surface of the back cover 130 and the outer side surface of the display panel 110 may become smaller.

Further, as illustrated in FIG. 8D, the outer side surface of the display panel 110 may be aligned with the outer side surface of the finishing frame 171.

The finishing frame 171 may have a constant thickness in a space corresponding to the distance d by setting the distance d between the outer side surface of the display panel 110 and the outer side surface of the finishing frame 171 to a predetermined value or more. Therefore, as the finishing frame 171 has a constant thickness, the outer side surface of the finishing frame 171 may be positioned close to the outer side surface of the display panel 110.

As illustrated in FIG. 8D, the bezel area of the display device 100 may be minimized by aligning the outer side surface of the finishing frame 171 with the outer side surface of the display panel 110.

Even in this case, the side surfaces of the display panel 110 may be rendered smooth by cutting the display panel 110 from the top surface to the bottom surface. Therefore, the resin layer 140 may not be disposed on the side surface of the display panel 110.

As such, the engagement portion 137 is formed by removing a part of the first layer 131 or the second layer 132 and a part of the core 133 close the removed layer. Therefore, engagement between the finishing portion 170 and the end portion of the back cover may be facilitated.

Further, the peripheral area of the display device 100 may have a clean outward appearance by controlling the arrangement structure or position of the finishing portion 170 according to the shape of the engagement portion 137.

Figure 9A:
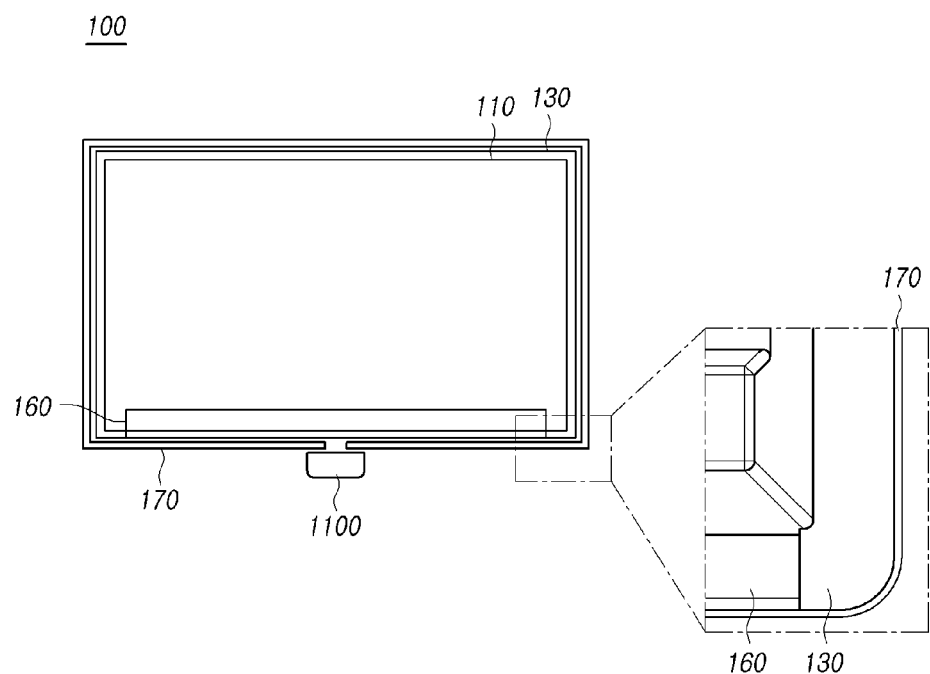
FIGS. 9A and 9B are reference diagrams illustrating another aspect of the finishing portion provided on a side surface of the back cover according to the present disclosure.
Figure 9B:
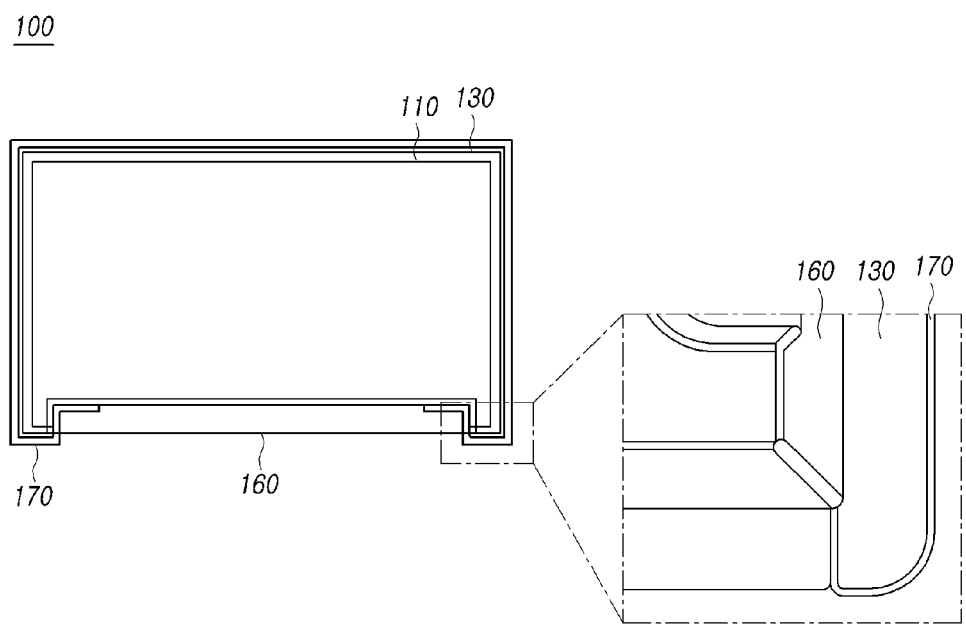

FIGS. 9A and 9B are reference diagrams illustrating different aspects of the finishing portion 170 on a side surface of the back cover 130 according to aspects of the present disclosure.

Referring to FIG. 9A, the finishing portion 170 is provided to surround a peripheral area of the display device 100. This finishing portion 170 may be formed of a film material to be attached around the peripheral area of the back cover 130 or the peripheral areas of the back cover 130 and the display panel 110.

For example, the finishing portion 170 of the film material may be applied as a deco film. The deco film may be attached to the peripheral area of the display device 100, thus forming the exterior of the display device 100. The display panel 110, the back cover 130, and the finishing portion (deco film) 170 may be attached and fixed again by the resin layer 140, as illustrated in FIG. 2.

As illustrated in FIG. 9A, the attachment of this finishing portion 170 may start from a lower center area of the display device 100, surround the periphery of the display device 100, and end again at the lower center area of the display device 100. Subsequently, a fixing portion 1100 may be attached at the lower center of the display device 100 to cover the starting and ending points of the attachment of the finishing portion 170. For example, the fixing portion 1100 covering the starting and ending points of the attachment of the finishing portion 170 may be attached in a cover structure along with a logo at a logo attaching position of the display device 100. Obviously, the starting and ending points of the attachment of the finishing portion 170 may be positioned in an area other than the lower center of the display device 100.

Further, referring to FIG. 9B, the finishing portion 170 is provided to surround the peripheral area of the display device 100. This finishing portion 170 may be formed of a film material to be attached around the peripheral area of the back cover 130 or the peripheral areas of the back cover 130 and the display panel 110.

As illustrated in FIG. 9B, the attachment of the finishing portion 170 may start from one portion of the lower side of the display device 100, surround the periphery of the display device 100, and end at the other portion of the lower side of the display device 100. That is, a part of the finishing portion 170 may be disposed up to an area in which a part of the back cover 130 is removed, for arrangement of the first circuit unit 151. As the cover shield 160 provided to cover the first circuit unit 151 is engaged with the display device 100, the cover shield 160 may cover the starting and ending points of the attachment of the finishing portion 170.

Figure 11:
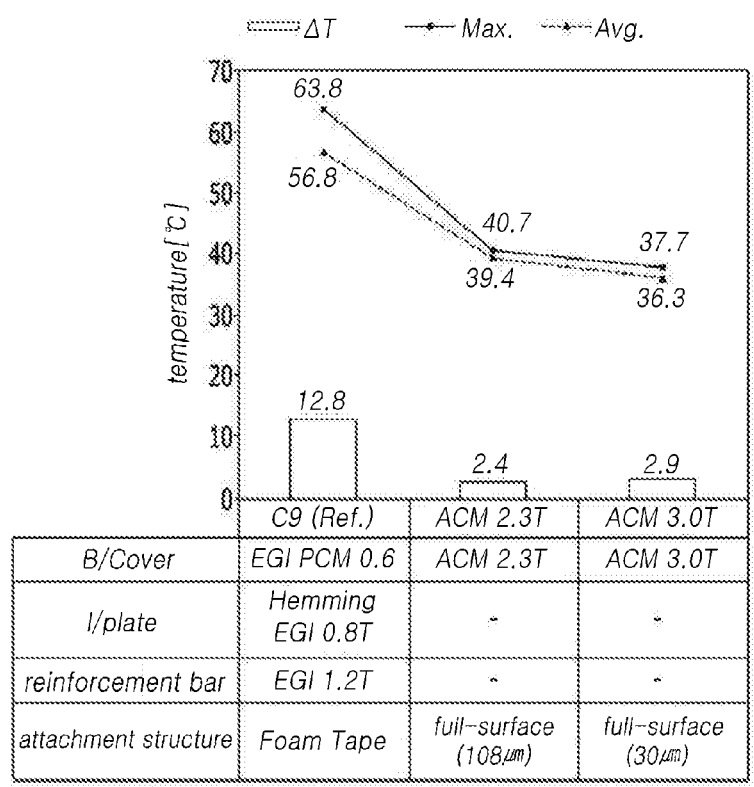

FIGS. 10 and 11 are graphs illustrating temperature changes according to attachment structures between the display panel 110 and the back cover 130 in the display device 100 according to aspects of the present disclosure. The same reference numerals as used before denote the same components herein.

Referring to FIG. 10, it may be noted that heat radiation performance is improved according to an attachment structure between the display panel 110 and the back cover 130.

In a conventional structure (a) in which the display panel 110 is attached to the back cover 130 partially by a foam tape, not fully by the panel adhesive layer 120, or the display panel 110 is just supported without any attachment, a reinforcement bar and an inner plate were added for strength reinforcement and an average temperature was recorded as 56.8□ (an upper portion of the graph in FIG. 10).

In contrast, the display panel 110 and the back cover 130 are attached to each other by a full-surface pressure-sensitive adhesive (PSA) in between in the structure (b) of the display device 100 according to aspects of the present disclosure. The temperature measurements of PSA adhesive layers which were 108 μm and 30 μm thick, respectively, were recorded as 39.4 and 36.3, respectively, as illustrated in FIG. 11. It may be noted from FIG. 10 that the temperature was remarkably dropped in the measurement of a black stain pattern in a 30-um PSA adhesive layer (a lower portion of the graph in FIG. 10), compared to the upper portion of the graph. The average temperature was dropped by about 20, with the decrease of the highest temperature by about 26 or more. Therefore, it was revealed that the full-surface attachment between the display panel 110 and the back cover 130 by the panel adhesive layer 120 increases heat conductivity and heat radiation performance.

Figure 12:
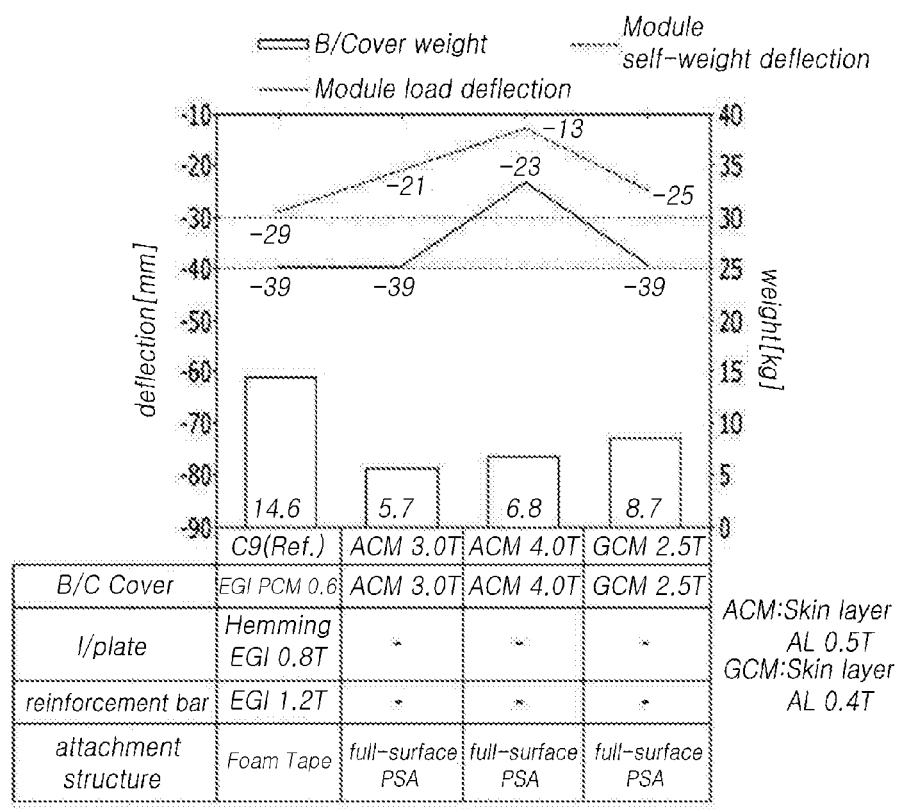
FIG. 12 is a graph illustrating strength changes according to weights of the back cover in the display device according to the present disclosure.

FIG. 12 is a graph illustrating strength changes according to weights of the back cover 130 of the display device 100 according to aspects of the present disclosure.

Referring to FIG. 12, C9 (Ref) on the left denotes a conventional back cover structure, and ACM and GCM on the right denote tests of the aspects of the present disclosure.

The conventional back cover structure had an increased back cover weight and a load deflection of 39 mm for the display panel 110 in view of addition of an inner plate (I/plate) and a reinforcement bar.

On the contrary, the back cover 130 according to aspects of the present disclosure experienced only changes in thickness and material. The attachment structure of the back cover 130 was tested by attaching the display panel 110 to the back cover 130 by a full-surface PSA in between. The result of the test reveals that the weight of the back cover 130 may be decreased to or below about 40% of the conventional back cover at maximum. At the same time, the load deflection was 39 mm, the same level of the conventional back cover. Further, the self-weight deflection may be decreased to or below 45% of that of the conventional back cover at maximum. Accordingly, because both the weight and the deflection may be reduced, a lightweight, thin display device 100 may be provided.

Figure 13:
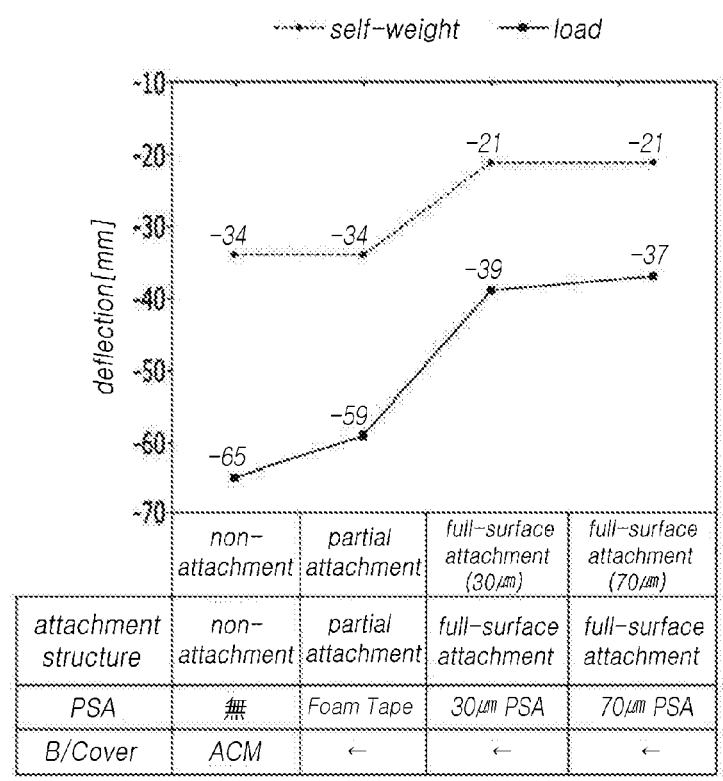
FIG. 13 is a graph illustrating deflections with respect to attachment areas between the display panel and the back cover in the display device according to the present disclosure.

FIG. 13 is a graph illustrating deflections with respect to areas over which the display panel 110 and the back cover 130 are attached to each other in the display device 100 according to aspects of the present disclosure.

Referring to FIG. 13, it may be noted that a larger attachment area between the display panel 110 and the back cover 130 reduces a self-weight deflection or a load deflection.

It may be noted that the load deflection is smaller in a structure in which the display panel 110 and the back cover 130 are attached to each other partially by a foam tape in between than in a structure the display panel 110 and the back cover 130 are not attached to each other. It may be noted that with the full-surface attachment between the display panel 110 and the back cover 130 by a PSA adhesive layer in between, the deflection is remarkably reduced.

Therefore, the full-surface attachment between the display panel 110 and the back cover 130 by the panel adhesive layer 120 increases heat radiation performance, while reducing a deflection.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:
1. A display device comprising:
a display panel;
a back cover disposed on a rear surface of the display panel and including a plurality of layers, and comprising a first layer positioned on the rear surface of the display panel and disposed in an area including an area overlapping with the display panel, a second layer disposed apart from the first layer to oppose the first layer and a core disposed between the first layer and the second layer;
a finishing portion surrounding at least a part of an outer side surface of the display panel and an outer side surface of the back cover;
a panel adhesive layer disposed between the display panel and the back cover; and
a resin layer integrally attaching side surfaces of the display panel and the panel adhesive layer, a top surface of the first layer, and a top surface or a side surface of the finishing portion to one another.

2. The display device according to claim 1, wherein the panel adhesive layer is disposed to attach an entire surface between the display panel and the back cover.

3. The display device according to claim 1, wherein the first layer and the second layer are formed of a metallic material, and the core is formed of plastic.

4. The display device according to claim 3, wherein the back cover further comprises core adhesive layers disposed between the first layer and the core, and between the second layer and the core, respectively.

5. The display device according to claim 1, wherein the first layer is extended longer than the second layer or the core, to form a first extension portion, and
wherein the first extension portion has a rear surface that accommodates a circuit unit.

6. The display device according to claim 5, further comprising a cover shield engaged to cover the circuit unit disposed on the rear surface of the first extension portion of the back cover.

7. The display device according to claim 6, wherein the cover shield includes a bent portion bent to contact the circuit unit.

8. The display device according to claim 1, further comprising a circuit unit disposed in an area in which the first layer of the back cover or the first layer and the core of the back cover are at least partially removed, and
wherein the circuit unit is disposed on the rear surface of the display panel, and the second layer covers the circuit unit.

9. The display device according to claim 8, wherein the second layer is disposed to contact the circuit unit.

10. The display device according to claim 1, wherein the back cover comprises a mounting recess in which the second layer and the core are partially removed, and
wherein a mounting portion provided on an installation surface is inserted into the mounting recess.

11. A display device comprising:
a display panel;
a back cover disposed on a rear surface of the display panel and including a plurality of layers; and
a finishing portion surrounding at least a part of an outer side surface of the display panel and an outer side surface of the back cover,
wherein the back cover comprises:
a first layer positioned on the rear surface of the display panel and disposed in an area including an area overlapping with the display panel;
a second layer disposed apart from the first layer to oppose the first layer; and
a core disposed between the first layer and the second layer, and
wherein the finishing portion comprises:
a finishing frame disposed on a side surface of an end portion of the back cover; and
a coupling frame protruding inward from the finishing frame to be inserted into an engagement recess in which the core is partially removed in an end portion of the back cover.

12. The display device according to claim 11, wherein the finishing portion comprises sealing portions disposed on a top surface and a bottom surface of the coupling frame, to interfere with facing surfaces of the first layer and the second layer.

13. The display device according to claim 11, wherein the finishing portion comprises a film layer on an outer side surface of the finishing frame.

14. A display device comprising:
a display panel;
a back cover disposed on a rear surface of the display panel and including a plurality of layers; and
a finishing portion surrounding at least a part of an outer side surface of the display panel and an outer side surface of the back cover,
wherein the back cover comprises:
a first layer disposed on the rear surface of the display panel;
a second layer disposed apart from the first layer to oppose the first layer; and
a core disposed between the first layer and the second layer, and
wherein the finishing portion comprises:
a finishing frame disposed on a side surface of an end portion of the back cover;
and
a coupling frame protruding inward from the finishing frame to be disposed in an engagement portion in which a part of the first layer or a part of the second layer is removed and a part of the core adjacent to the removed layer being one of the first layer and the second layer is removed, in an end portion of the back cover.

15. The display device according to claim 14, wherein, when the part of the second layer is removed, a part of the core remains between the coupling frame and the first layer, and the thickness of the part of the core is smaller than a straight-line thickness between the first layer and the second layer.

16. The display device according to claim 14, wherein, when the part of the first layer is removed, a part of the core remains between the coupling frame and the second layer, and the thickness of the part of the core is smaller than a straight-line thickness between the first layer and the second layer.

17. The display device according to claim 16, wherein the outer side surface of the back cover is more inward than the outer side surface of the display panel.

18. The display device according to claim 17, wherein an outer side surface of the finishing frame is aligned with the outer side surface of the display panel.

* * * * *